(12) United States Patent
Shi

(10) Patent No.: US 6,885,565 B2
(45) Date of Patent: Apr. 26, 2005

(54) RETENTION DEVICE FOR EXPANSION CARDS

(75) Inventor: DeYi Shi, Shenzhen (CN)

(73) Assignee: Hon Hai Precision Ind. Co., LTD, Taipei Hsien (TW)

(*) Notice: Subject to any disclaimer, the term of this patent is extended or adjusted under 35 U.S.C. 154(b) by 0 days.

(21) Appl. No.: 10/654,539

(22) Filed: Sep. 2, 2003

(65) Prior Publication Data

US 2004/0190228 A1 Sep. 30, 2004

(30) Foreign Application Priority Data

Mar. 28, 2003 (TW) ........................................ 92204914 U

(51) Int. Cl.[7] .............................................. H05K 7/12
(52) U.S. Cl. ...................... 361/801; 361/732; 361/747; 361/759
(58) Field of Search .............................. 361/801, 759, 361/740, 747, 732, 726; 439/61, 327; 248/316.4

(56) References Cited

U.S. PATENT DOCUMENTS

| | | | | |
|---|---|---|---|---|
| 5,383,793 A | * | 1/1995 | Hsu et al. | 439/327 |
| 5,754,406 A | * | 5/1998 | Hardt et al. | 361/756 |
| 5,822,193 A | * | 10/1998 | Summers et al. | 361/759 |
| 5,996,962 A | * | 12/1999 | Chang et al. | 248/694 |
| 6,229,709 B1 | * | 5/2001 | Hardt et al. | 361/753 |
| 6,299,468 B1 | * | 10/2001 | Lin | 439/327 |

FOREIGN PATENT DOCUMENTS

| | | |
|---|---|---|
| TW | 197801 | 1/1993 |
| TW | 435733 | 5/2001 |
| TW | 488528 | 5/2002 |

* cited by examiner

*Primary Examiner*—Kamand Cuneo
*Assistant Examiner*—Dameon E. Levi
(74) *Attorney, Agent, or Firm*—Wei Te Chung

(57) ABSTRACT

A retention device (10, 10') for an expansion card (30) mounted in a cage (70), includes an attaching member (12) attached in the cage and located above the expansion card, and a pressing member (14) slidably attached to the attaching member for pressing a top of the expansion card. The pressing member includes engaging means (28, 28'), and the attaching member includes an elastic catch (22, 22') which can engage a selected part of the engaging means. The elastic catch includes a handle (26) for facilitating disengagement of the catch from the engaging means. A length of the pressing member protruding from the attaching member is adjustable such that the retention device can fit a variety of differently sized expansion cards.

17 Claims, 4 Drawing Sheets

RETENTION DEVICE FOR EXPANSION CARDS

BACKGROUND OF THE INVENTION

1. Field of the Invention

The present invention relates to retention devices used in apparatus such as computers, and more particularly to a retention device which can be adapted for securing a variety of different expansion cards.

2. Description of Related Art

Personal computers have become part of modern daily life. Hardware devices are often installed as extras into a stock personal computer to satisfy the particular requirements of individual users. Expansion cards, such as display cards or network cards, are perhaps the most common add-on hardware devices. An expansion card is typically oblong, with an edge connector provided on a long side thereof. Conventionally, expansion cards are only restrained in a personal computer enclosure at one end thereof. This results in a problem of vibration and deflection along a length of the card, especially in rugged environments such as during shipping of the enclosure.

Retention devices for pressing top sides of expansion cards have been developed. Taiwan Patent Publication No. 488,528 discloses a retention device for stabilizing expansion cards. The retention device comprises a bar located above expansion cards. A plurality of fixing members is attached to the bar. Each fixing member comprises a pressing portion pressing on a top side of a corresponding expansion card.

However, this kind of retention device can only be used for one kind of expansion card, where each expansion card has a same height. If heights of the expansion cards vary, the retention device is inadequate.

SUMMARY OF THE INVENTION

Accordingly, an object of the present invention is to provide a retention device which can be used for a variety of differently sized expansion cards.

To achieve the above object, a retention device for an expansion card mounted in a cage in accordance with the present invention comprises an attaching member attached in the cage and located above the expansion card, and a pressing member slidably attached to the attaching member for pressing a top of the expansion card. The pressing member comprises engaging means, and the attaching member comprises an elastic catch which can engage with a part of the engaging means. The elastic catch comprises a handle for facilitating disengagement of the catch from the engaging means. A length of the pressing member protruding from the attaching member is adjustable such that the retention device can be used for a variety of differently sized expansion cards. The engaging means may be a plurality of teeth or sockets.

Other objects, advantages and novel features of the present invention will be drawn from the following detailed description of preferred embodiments of the present invention with the attached drawings, in which:

DESCRIPTION OF THE PREFERRED EMBODIMENTS

Figure 1:
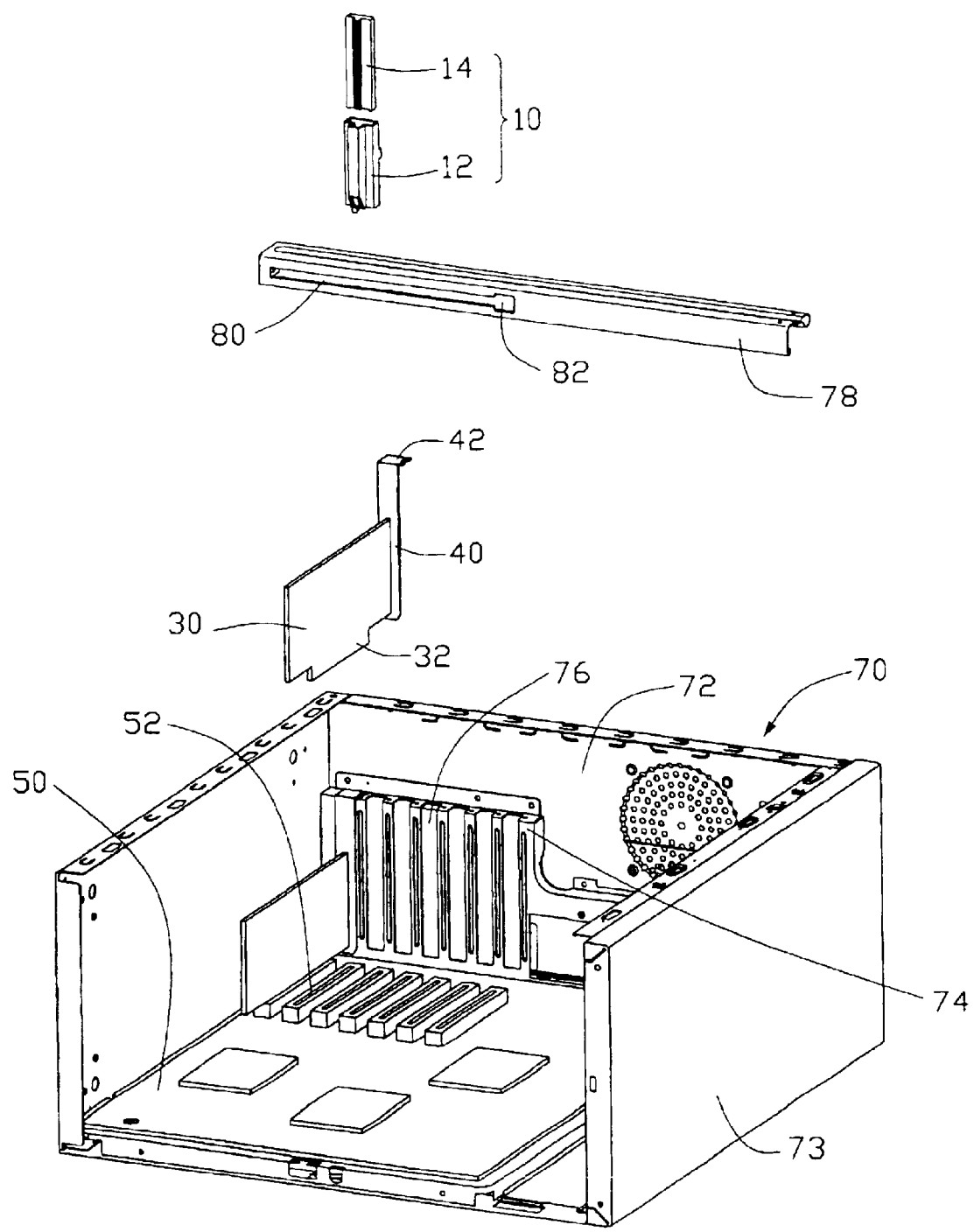
FIG. 1 is an exploded isometric view of a retention device in accordance with a preferred embodiment of the present invention, together with a computer cage and two expansion cards.

FIG. 1 shows a retention device 10 in accordance with the preferred embodiment of the present invention for stabilizing an expansion card 30 in a computer cage 70. The expansion card 30 comprises an inserting portion 32 at a bottom thereof, and has a slot cover 40 attached on a front thereof. The slot cover 40 comprises a bent fixing tab 42 at a top thereof. The cage 70 comprises a bottom plate 50, a rear plate 72 extending perpendicularly from a rear edge of the bottom plate 50, and a pair of side plates 73 extending from opposite side edges of the bottom plate 50. A plurality of sockets 52 is provided on the bottom plate 50, for insertion of a plurality of the expansion cards 30 thereinto. An expansion card seat 74 is attached to the rear plate 72. The expansion cards seat 74 defines a plurality of expansion slots 76 for receiving a plurality of the expansion cards 30 thereat. A bar 78 is fixed in the cage 70 above the sockets 52, with opposite ends of the bar 78 fixed to the side plates 73 respectively. A groove 80 is defined in the bar 78. The groove 80 comprises a large entrance 82.

Figure 2:
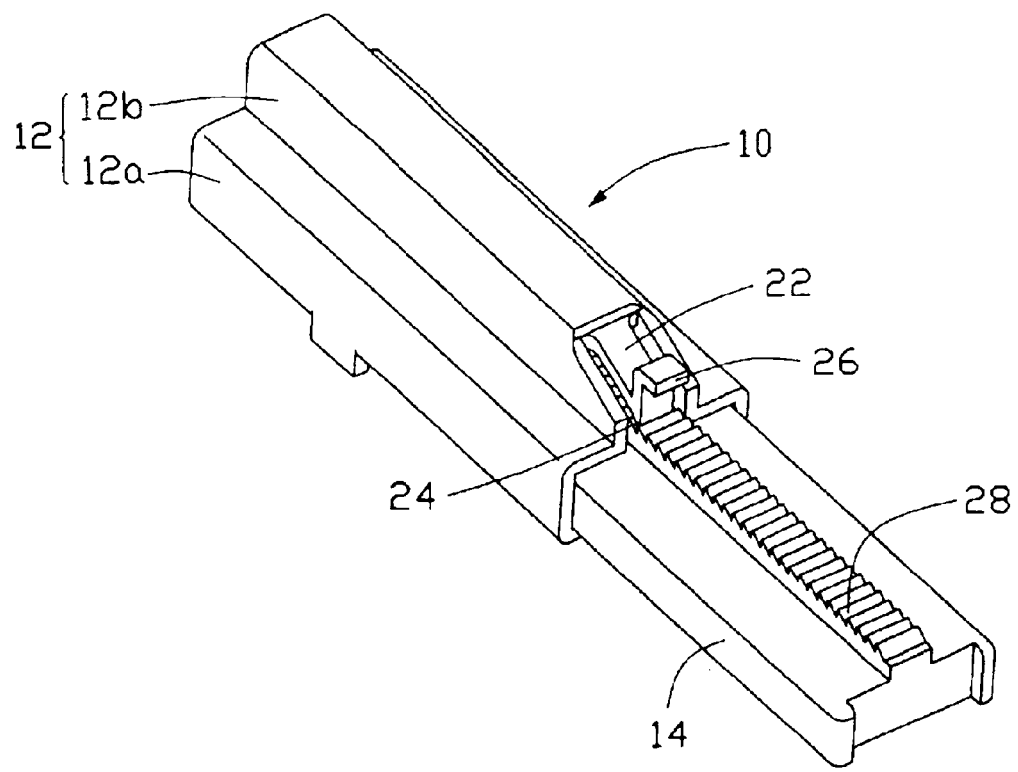
FIG. 2 is an enlarged, isometric view of the retention device of FIG. 1 assembled together and viewed from another aspect.
Figure 3:
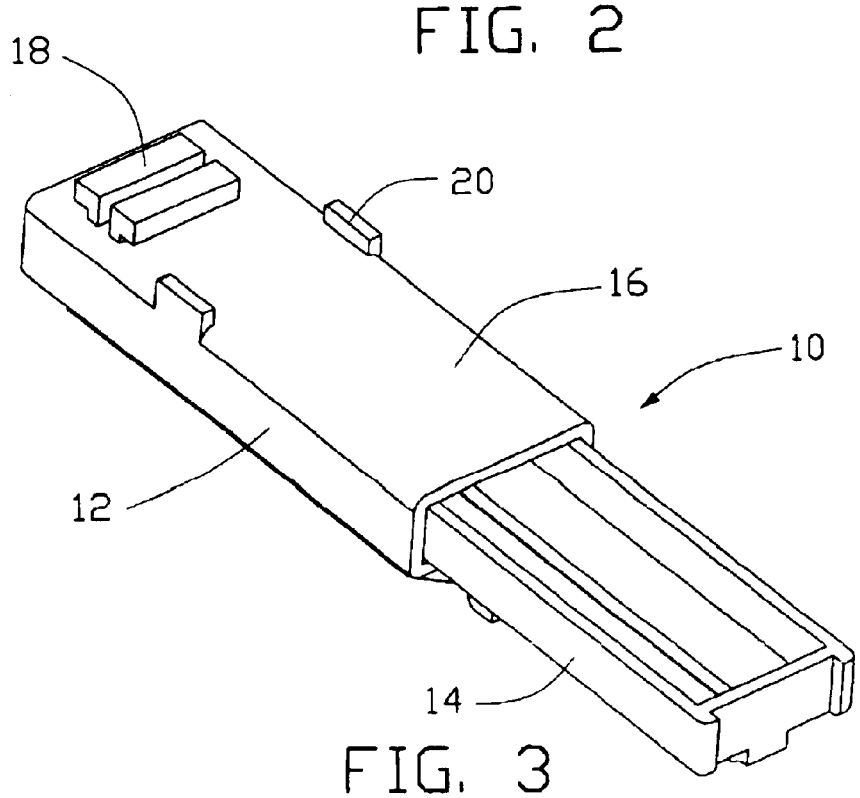
FIG. 3 is similar to FIG. 2, but viewed from another aspect.

Referring also to FIGS. 2–3, the retention device 10 comprises an attaching member 12 and a pressing member 14. The attaching member 12 comprises a hollow large portion 12a, and a hollow small portion 12b formed on a front of the large portion 12a. An elastic catch 22 is formed on a bottom of the small portion 12b. The catch 22 comprises a tooth 24 and a handle 26. The large portion 12a comprises a rear plate 16. A pair of rails 18 is formed on a top portion of the rear plate 16, for sliding in the groove 80 of the bar 78. A pair of blocks 20 is formed on opposite sides of the rear plate 16 respectively, below the rails 18. The pressing member 14 is slidably received in the large portion 12a of the attaching member 12. A plurality of dentations 28 is formed on a front face of the pressing member 14, for adjustably engaging with the tooth 24 of the attaching member 12.

Figure 4:
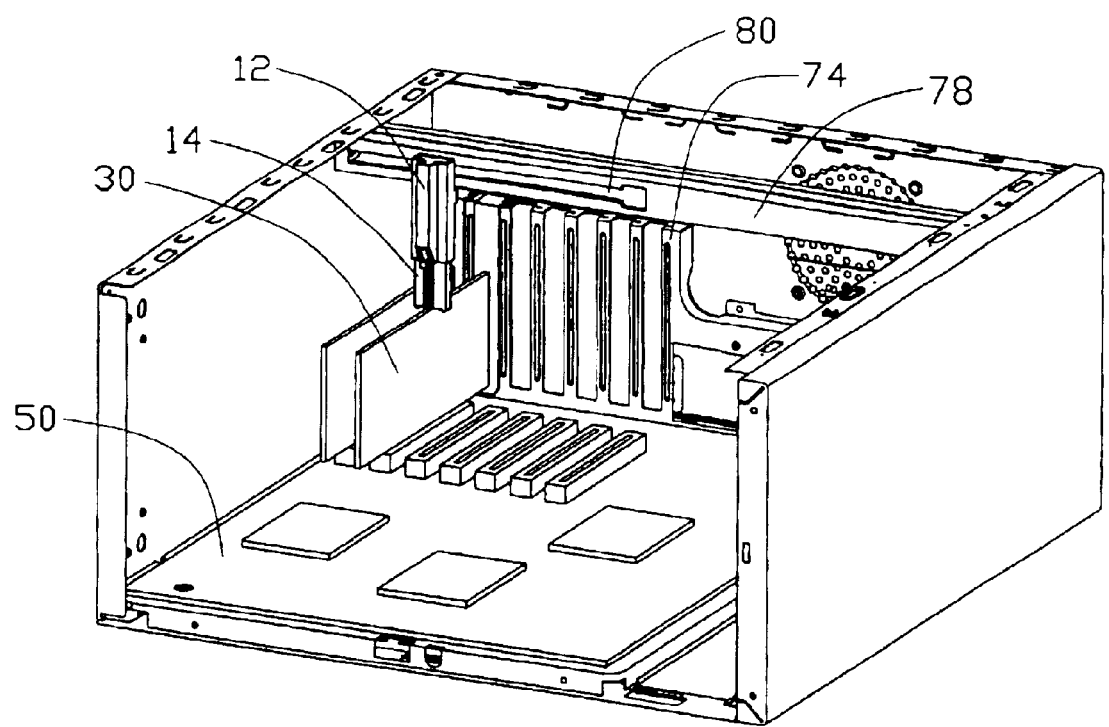
FIG. 4 is an assembled view of FIG. 1.

Referring also to FIG. 4, in use, the expansion card 30 is received in the cage 70. The inserting portion 32 of the expansion card 30 is inserted into a corresponding socket 52 of the cage 70. The slot cover 40 of the expansion card 30 is received in a corresponding expansion slot 76. The fixing tab 42 of the slot cover 40 is fixed to the expansion card seat 74 by conventional means. The retention device 10 is attached to the bar 78, with the rails 18 entering the groove 80 via the entrance 82. The retention device 10 is slid along the groove 80 to locate above the expansion card 30. The pressing member 14 is slid downwardly until a bottom end thereof abuts a top end of the expansion card 30. The tooth 24 of the attaching member 12 engages with a corresponding dentation 28. The blocks 20 abut against a bottom of the bar 78. Thus, the pressing member 14 firmly presses on the top end of the expansion card 30.

In removal of the retention device 10, the handle 26 is pulled forward. The tooth 24 is thereby disengaged from the corresponding dentation 28. The pressing member 14 is moved upward in the attaching member 12. The retention device 10 is thus released from the expansion card 30.

Figure 5:
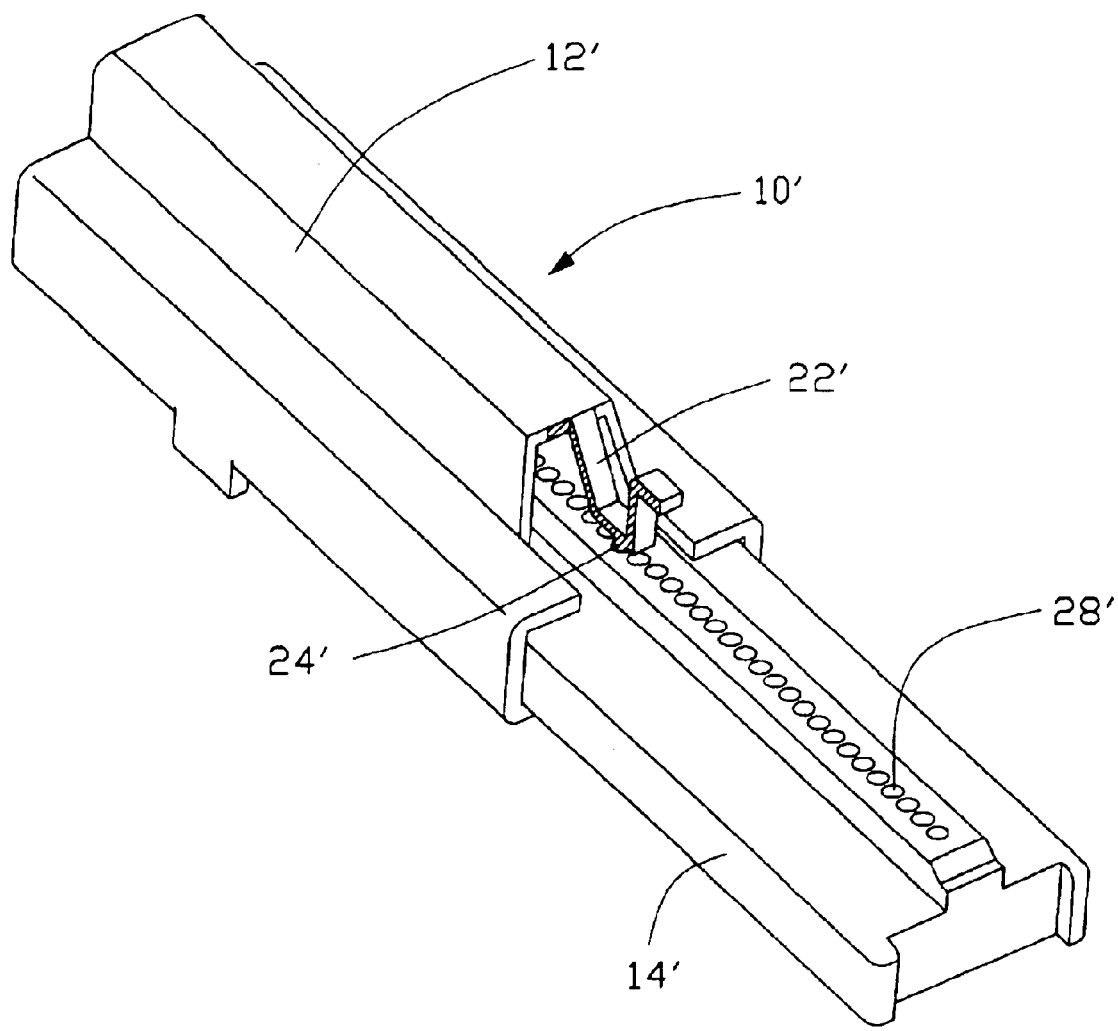
FIG. 5 is an isometric view of a retention device in accordance with an alternative embodiment of the present invention, with one part thereof cut away.

FIG. 5 shows a retention device 10' in accordance with the alternative embodiment of the present invention. The retention device 10' comprises an attaching member 12' and a pressing member 14'. The attaching member 12' is similar to the attaching member 12 of the preferred embodiment, except that the tooth 24 of the catch 22 of the preferred embodiment is replaced by a spline 24' of a catch 22'. The pressing member 14' is similar to the pressing member 14 of the preferred embodiment, except that the dentations 28 of the preferred embodiment are replaced by sockets 28'. Use and removal of the retention device 10' are substantially the same as use and removal of the retention device 10 of the preferred embodiment.

In the present invention, the pressing member 14, 14' can be slid upward and downward in the attaching member 12, 12'. A length of the pressing member 14, 14' protruding below the attaching member 12 is adjustable. Therefore, the retention device 10, 10' can be used with a variety of differently sized expansion cards 30.

While the present invention has been illustrated by the description of the embodiments thereof, and while the embodiments have been described in considerable detail, it is not intended to restrict or in any way limit the scope of the appended claims to such detail. Additional advantages and modifications within the spirit and scope of the present invention will readily appear to those skilled in the art. Therefore, the present invention is not limited to the specific details and illustrative examples shown and described.

What is claimed is:

1. A retention device for securing an expansion card mounted in a cage, the retention device comprising:
   an attaching member adapted to be attached in the cage and located above the expansion card, the attaching member comprising a spline; and
   a pressing member slidably attached to the attaching member, the pressing member comprising a free end adapted to press the expansion card, and a plurality of sockets for engagingly receiving the spline, wherein
   a length of the pressing member protruding from the attaching member is adjustable such that the retention device can be used for a variety of differently sized expansion cards.

2. The retention device as claimed in claim 1, wherein the attaching member comprises a hollow large portion and an adjoining hollow small portion, the pressing member being received in the large portion, an elastic catch being formed at a bottom of the small portion.

3. The retention device as claimed in claim 2, wherein the elastic catch comprises the spline and a handle for facilitating disengagement of the spline from the sockets.

4. A computer enclosure comprising:
   a cage providing an expansion card seat, a plurality of sockets, and a bar arranged above the sockets;
   an expansion card secured to the expansion card seat and inserted in one of said sockets; and
   a retention device comprising an attaching member slidably attached to the bar, and a pressing member slidably attached to the attaching member and pressing on the expansion card, wherein
   by sliding the pressing member relative to the attaching member, a length of the retention device between a point of attachment of the attaching member with the bar and a point of engagement of the pressing member with the expansion card is adjustable such that the retention device can be used for a variety of differently sized expansion cards.

5. The computer enclosure as claimed in the claim 4, wherein the pressing member comprises engaging means, and the attaching member comprises an elastic catch engageable with a selected part of the engaging means.

6. The computer enclosure as claimed in the claim 5, wherein the elastic catch comprises a handle for facilitating disengagement of the catch from the engaging means.

7. The computer enclosure as claimed in claim 6, wherein the attaching member comprises a hollow large portion and an adjoining hollow small portion, the pressing member being received in the large portion, the catch being formed at a bottom of the small portion.

8. The computer enclosure as claimed in claim 6, wherein the elastic catch further comprises a tooth portion, and the engaging means is a plurality of teeth.

9. The computer enclosure as claimed in claim 6, wherein the elastic catch further comprises a spline, and the engaging means is a plurality of sockets for engagingly receiving the spline.

10. The computer enclosure as claimed in claim 4, wherein the bar defines a groove, and the attaching member comprises at least one rail slidably engaging in the groove.

11. The computer enclosure as claimed in claim 10, wherein the attaching member further comprises a pair of blocks abutting a bottom of the bar.

12. The computer enclosure as claimed in claim 4, wherein the cage comprises a bottom plate on which the sockets are provided, a rear plate on which an expansion card seat is provided, and a pair of side plates between which the bar is secured.

13. A computer enclosure assembly comprising:
   a vertical expansion card defining a plane;
   a crossbar located above the expansion card and extending in a lengthwise direction perpendicular to said plane;
   a retention device located between said crossbar and said expansion card, end including an upper part slidably attached to the crossbar in the lengthwise direction and constantly immoveable relative thereto in a vertical direction perpendicularly to said lengthwise direction, and a lower part associated with said upper part and being restrictively moveable relative thereto in the vertical direction; wherein said lower part engages an upper portion of the expansion card for preventing upward movement of the expansion card.

14. The assembly as claimed in claim 13, wherein said retention device is moveable relative to the crossbar along said lengthwise direction when the lower part is disengaged from the upper portion of the expansion card.

15. The assembly as claimed in claim 13, wherein said retention device includes a ratchet structure allowing one way engagement between the retention device and the expansion card.

16. The assembly as claimed in claim 13, wherein the bar defines a groove, and the upper part of the retention device comprises at lease one rail slidably engaging in the groove.

17. The assembly as claimed in claim 13, wherein the upper part of the retention device comprises a spline, and the lower part of the retention device includes a plurality of sockets for engagingly receiving the spline and a handle for facilitating disengagement of the spline from the sockets.

* * * * *